United States Patent [19]

Magee et al.

[11] Patent Number: 5,151,135
[45] Date of Patent: Sep. 29, 1992

[54] METHOD FOR CLEANING SURFACES USING UV LASERS

[75] Inventors: Thomas J. Magee, Belmont; Charles S. Leung; Richard L. Press, both of San Jose, all of Calif.

[73] Assignee: Amoco Corporation, Chicago, Ill.

[21] Appl. No.: 407,817

[22] Filed: Sep. 15, 1989

[51] Int. Cl.$^5$ .................... H01L 21/268; B08B 7/00
[52] U.S. Cl. ........................ 134/1; 437/173; 437/939; 437/946; 148/DIG. 17
[58] Field of Search ............... 134/1; 156/643; 437/173, 939, 946; 148/DIG. 17

[56] References Cited

U.S. PATENT DOCUMENTS

| | | | |
|---|---|---|---|
| 4,292,093 | 9/1981 | Ownby | 437/946 |
| 4,568,632 | 2/1986 | Blum et al. | 430/322 |
| 4,733,944 | 3/1988 | Fahlen | 350/167 |
| 5,024,968 | 6/1991 | Engelsberg | 437/939 |

FOREIGN PATENT DOCUMENTS

| | | | |
|---|---|---|---|
| 0297506 | 1/1989 | European Pat. Off. | 134/1 |
| 0242760 | 2/1987 | Fed. Rep. of Germany | 134/1 |
| 0130416 | 8/1982 | Japan | 437/939 |
| 0075528 | 4/1986 | Japan | 437/173 |
| 0279131 | 12/1986 | Japan | 437/173 |
| 2169496 | 7/1986 | United Kingdom | 134/1 |

OTHER PUBLICATIONS

"Atomically clean semiconductor surfaces prepared by laser irradiation", McKinley et al., J. Phys. D: Appl. Phys., 13(1980), pp. L193–L197.

"Atomically clean surfaces by Pulsed Laser Bombardment", S. M. Bedair and P. Smith, Journal of Applied Physics, vol. 10, No. 12, Nov. 1969.

Primary Examiner—Robert Kunemund
Assistant Examiner—Ourmazd S. Ojan
Attorney, Agent, or Firm—Norval B. Galloway; William H. Magidson; Robert J. Wagner

[57] ABSTRACT

The invention relates to a new method for cleaning chemical, metallic and particulate contaminants from solid surfaces. The new method comprises irradiating the surface with essentially ultraviolet laser radiation whose parameters are selected to avoid causing substantial chemical or physical change at the surface.

17 Claims, 1 Drawing Sheet

METHOD FOR CLEANING SURFACES USING UV LASERS

FIELD OF THE INVENTION

The present invention relates to a method for removing chemical, metallic and particulate contaminants from a solid surface to render it clean. More particularly, it relates to a method for removing chemical impurities such as carbon and oxygen; metallic impurities such as sodium, calcium, magnesium and potassium; and particulates made up of various hydrocarbons and other materials from surfaces. The invention affords enhanced cleaning for a variety of solid surfaces relative to conventional techniques.

BACKGROUND OF THE INVENTION

The continued evolution of computer and optical technologies has resulted in increasing demands for chemically clean and particulate-free surfaces and, hence, a rapid and effective means for producing them. For example, as computer technology continues to rely on state-of-the-art microelectronics, and microelectronic devices continue to shrink in size, computer technology has become increasingly vulnerable to chemical and particulate contaminants. Particles from "clean" rooms and processing equipment are increasingly a significant problem. See generally "Device Materials and Processing Beyond VHSIC," by Bowling et al., August 1987, a report prepared for the Defense Advanced Research Project Agency of the Office of Naval Research, Arlington, Va.

Amorphous thin film structures are used in a variety of industrial applications including the manufacture of semiconductor and optical components, magnetic disk storage media, wear and corrosion resistant coating materials, industrial plating, solar cells, thin film transistors and reflection control coatings for transmissive and reflective optical elements. However, such thin film structures are also adversely affected by the presence of microparticulates, chemical residues and metallic debris on base layers. Such contaminants impede the growth, adhesion, wear resistance and stability of the thin films in these applications.

Conventional methods for cleaning single crystalline and amorphous surfaces include in-vacuum cleavage, in-vacuum evaporation, chemical etching and electron beam scrubbing. None of these has proven entirely satisfactory. See e.g., U.S. Pat. No. 4,292,093 to Ownby et al. and "Preparation of Atomically Clean Silicon Surfaces by Pulsed Laser Irradiation," by D. M. Zehner et al., Appl. Phys. Lett. 36 (1), Jan. 1, 1980, pp. 56-59. Moreover, chemical etching techniques utilize materials such as hydrofluoric, sulfuric, nitric and other strong acids and organic solvents such as trichloroethane and various complexing agents. These materials are plainly hazardous and subject to environmental concerns.

More recently, others have investigated the use of lasers to clean such surfaces. The laser methods disclosed to date invariably rely on the transmission of sufficient energy to induce thermal melting and recrystallization at the subject surface. These include, for example, ruby lasers ("Preparation of Atomically Clean Silicon Surface by Pulsed Laser irradiation," by Zehner et al., supra), Q-switched ruby lasers ("Laser Cleaning of GaAs Surfaces in Vacuo," Rodway et al., Appl. of Surface Science, 6, 1980, pp. 76-81), Nd-YAG lasers (U.S. Pat. No. 4,292,093 to Ownby et al.) and argon-ion lasers ("Effect of Low Intensity Laser Radiation During Oxidation of the GaAs (110) Surface," Petro et al., J. Vac. Sci. Technol., 21(2), July/August 1982, pp. 405-408) and KrF excimer lasers ("Excimer-laser Gas-assisted Deposition of Crystalline and Amorphous Films," Reddy, J. Opt. Soc. Amer. B, 3(5), May 1986).

As yet, however, such laser-based cleaning methods are still too slow or too ineffective to enable their use in a commercially viable cleaning process. Laser annealing also tends to introduce point defects, and enhances cracking and other irregularities at the substrate surface and thin film/substrate interface. In addition, impurities or microparticulates residing on the surface are not actually removed by these processes, but rather incorporated into the molten surface layer, producing localized doping and secondary defect nucleation.

Accordingly, it is an object of this invention to provide a novel method for cleaning surfaces. More particularly, it is an object of the invention to provide a rapid and effective method for removing chemical and metallic impurities and particulate debris from surfaces. It is still another object of the invention to provide a method for removing such impurities and debris from surfaces without the use of toxic or hazardous chemicals and without imparting substantial chemical or physical change to the surface.

It is a further object of the invention to provide a rapid and effective method for removing such impurities and debris from essentially single crystalline and amorphous materials used to make microelectronic devices, optical components, magnetic disk storage media, solar cells, thin film transistors and such other devices as described earlier without degrading the surface. It is still another object of the invention to provide a novel method for removing elemental impurities such as carbon, oxygen, sodium, calcium, potassium, magnesium and the like from such surfaces.

SUMMARY OF THE INVENTION

The present invention provides a rapid and effective method for cleaning a solid surface by using short, low energy pulses of ultraviolet laser radiation to sweep the surface without imparting substantial chemical or physical change to it. Preferably, the invention is used for cleaning essentially single crystalline and amorphous surfaces used in the manufacture of micro-electronic devices, components of optical devices and thin film structures and can be used to supplement or even replace current conventional cleaning techniques. When the peak-power density and duration of the pulse are kept below the threshold for surface annealing, such cleaning enhances reflectivity and substantially reduces impurities and particulates at the surface thereby improving the performance of fabricated devices and decreasing the number of fatal defects occurring device fabrication. While the invention is discussed below primarily in terms of such applications, the discussion is not intended to limit the invention to these applications. Useful radiation ranges from wavelengths of about 180 to about 435 nm. Preferably, the laser pulses are about 80 nanoseconds or less in duration and have a peak-power density which is uniform to at least about ±10%. More preferably, the peak-power density is uniform to at least about ±5%. The invention may be integrated into a multi-step fabrication process and, hence, applied repeatedly following successive processing steps on the surface.

DETAILED DESCRIPTION OF THE INVENTION

Figure 1:
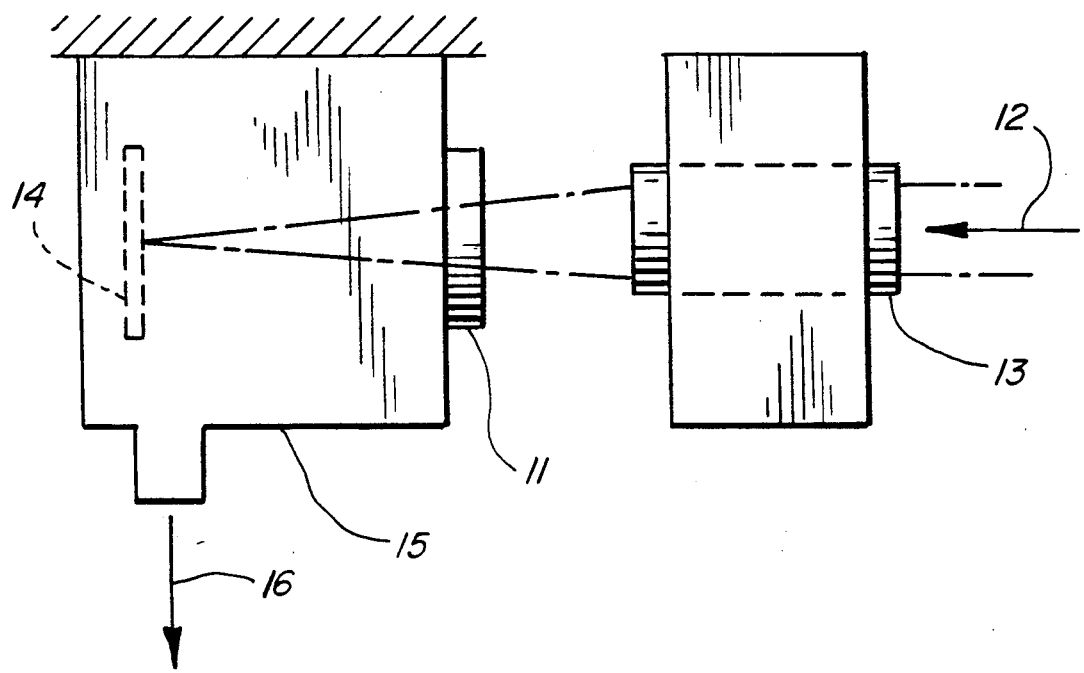
FIG. 1 displays a schematic for an apparatus suitable for use in the method for cleaning surfaces of the present invention.

The present invention applies generally to the removal of impurities, particulates and other contaminants found at solid surfaces. A preferred use of the invention is the removal of impurities, particulates and contaminants from the surface of materials used to make microelectronic devices, and thin film structures such as those used in magnetic recording disks, high quality mirrors for reflection and transmission optics, optical blanks and components for other optical devices. Such materials may be essentially crystalline or amorphous or anywhere in between. Low energy pulsed ultraviolet laser radiation is broadly applicable for cleaning a wide variety of surfaces which include, but are not limited to, essentially single crystalline materials such as GaAs, AlGaAs, InP, InSb, CdTe, CdZnTe, HgCdTe, Si and Ge, and essentially amorphous materials such as fused silica, CoNiP, CdTe, Si, $SiO_2$, $MgF_2$, ZnSe, ZnS, AlAs, GaAs, AlGaAs, $Cr_2O_3$, GaP, GaSb, InP, InAs, $Al_2O_3$, Al, Cr, Au, Be, Ni and diamond. When the peak-power density (i.e., energy density or intensity) of the laser pulses is kept below the threshold for causing substantial chemical or physical changes to the surface, the invention affords a rapid and effective means for cleaning. When pulse energy densities are kept below the threshold for inducing melting or annealing at a crystalline surface, microelectronic and optical devices and thin film structures may be produced with fewer defects and higher reflectivities. Moreover, the need for the more conventional methods of cleaning and the problems attendant thereto may be reduced or eliminated entirely.

Particles are believed to bind to such surfaces by capillary forces and electrostatic interactions between the particles and the surfaces. Submicron particles often have a high charge density and so can be very tightly bound; they are particularly difficult to remove by wet or chemical cleaning. Hydrocarbon residues and metallic impurities are believed to bind to surfaces through dipole-dipole interactions and overlap with electronic orbitals of the crystal surface and other molecules adsorbed into the surface.

Conventional cleaning procedures may remove some of the more simply bound contaminants, but conventional procedures seem unable to remove more complexly bound materials. Some conventional procedures even complicate the cleaning. Thermal desorption (heating), for example, may convert hydrocarbon contaminants into other compounds which are even more difficult to remove. Moreover, laser cleaning methods which induce melting and/or annealing at the surface may introduce point defects and other surface irregularities, and may also permit some impurities to diffuse into the crystal at the same time others are removed.

Interestingly, many surface complexes and hydrocarbons strongly absorb ultraviolet radiation. Lasers emitting radiation in the approximate range of 180-435 nm are able to break bonds, and in the practice of this invention, fragment and vaporize such contaminants at relatively low intensities. The radiation should be emitted in short pulses, however, to prevent heat from transferring into the surface and induce annealing, melting, the introduction of point defects or other changes at the surface. Normally, pulse durations of less than about 120 nanoseconds afford useful cleaning; pulse durations of about 80 nanoseconds or less are preferred.

Useful surface cleaning as contemplated by the present invention employs coherent radiation with a wavelength in the range of about 180-435 nm, i.e., essentially ultraviolet radiation. Such radiation may be obtained from a variety of sources. Excimer lasers, for example, emit coherent radiation in this range. Similarly, lasers generating radiation in the near infrared domain, such as but not limited to neodymium and argon lasers, but which are subjected to frequency doubling or frequency quadrupling afford useful surface cleaning.

Useful surface cleaning also requires that the intensity of laser pulses is low enough to avoid annealing, melting or other substantial chemical or physical change at the surface. (Normally, it is considered that melting occurs at higher pulse intensities and/or longer pulse durations than is required for surface annealing.) The examples herein show that useful surface cleaning of single crystalline and amorphous materials can often be obtained by applying pulse intensities in the range of about 0.1 to 0.3 $J/cm^2$. Single crystalline silicon wafers, for example were usefully cleaned with a pulse intensity of 0.3 $J/cm^2$. Similarly, GaAs and CdTe single crystals were cleaned using pulse intensities of 0.15 $J/cm^2$ and 0.11 $J/cm^2$, respectively. Amorphous quartz surfaces were cleaned using a pulse intensity of 0.30 $J/cm^2$. Thin films of beryllium and CoNiP were cleaned using pulse intensities of 0.25 $J/cm^2$ and 0.1 $J/cm^2$, respectively. It should be understood that the range of pulse intensities available for useful surface cleaning will vary with respect to the surface to be cleaned. It is not intended that the invention be limited by range of intensities identified herein or the individual intensities specified in the examples.

Effective cleaning is normally accomplished by a single laser pulse per exposure area. Enhanced cleaning may also be obtained using two or more pulses per exposure area. Two or more pulses per exposure area may also be required to obtain useful cleaning if the subject material is heavily contaminated or because lower than normal pulse intensities are required to avoid surface damage.

It is well within the skill of those practicing this art to determine an appropriate intensity and number of laser pulses per exposure area to obtain useful, damage-free cleaning. For example, the lasers used for surface cleaning may be outfitted with optical microscopes to permit monitoring the removal of particulates and debris and any changes in the surface structure that result from the laser pulses. Similarly, a single-pass cylindrical mirror analyzer may be employed to monitor the removal of surface impurities by Auger electron spectroscopy.

Lasers which can be used for cleaning by the present invention should be able to maintain shot-to-shot repeatability with minimum discharge variation over a sufficiently large target area. Lasers described in U.S. Pat. Nos. 4,549,091 and 4,611,327 and the Model 5100 excimer laser available commercially from XMR, Inc., Santa Clara, Calif., provide such shot repeatability and pulse uniformity.

Useful cleaning is also facilitated by use of an optical homogenizer to enhance pulse uniformity over an adequate area of the surface. Lasers using conventional lens systems are prone to incomplete and ineffective cleaning because they produce nonuniform pulses. Such pulses often convert adsorbed contaminants at the edges of the irradiated area into new materials which are more difficult to remove than the original contaminants. Uniform pulses, however, are less likely to do so and have the added advantage of permitting the pulses to be swept across surfaces at rates necessary for cleaning on a commercial scale. For example, a laser pulse with an exposure area of a 0.25 cm² square spot can be swept at an effective velocity of about 1 cm/sec using conventional sweeping means. Uniform pulses also permit effective localization at a minimum expenditure of time and energy should it be necessary to apply additional cleaning to particular surface areas. By uniform pulses is meant pulses which are uniform in both spatial dimensions of the pulse and which are characterized by a "top hat" intensity profile as described in U.S. Pat. No. 4,733,944 assigned to XMR, Inc., which is incorporated herein by reference. Pulse uniformity to at least $\pm 10\%$ is preferred; pulse uniformity to at least $\pm 5\%$ is more preferred. The optical homogenizers described in U.S. Pat. No. 4,733,944 and the Model 0016 homogenizers, commercially available from XMR, Inc., provide advantageous pulse uniformity.

The invention and the advantages attendant thereto are illustrated in greater detail in the following examples.

EXAMPLES

In general, the single crystals and amorphous surfaces used in the examples are typical of commercially available materials. Laser cleaning was performed in an apparatus as depicted in FIG. 1. The vacuum system included an AR-coated quartz window (11) for coupling 308 nm UV light (12) from a XeCl excimer laser comparable to the Model 5100 excimer laser available from XMR, Inc. The laser was fitted with an optical homogenizer (13) comparable to the Model 0016 series homogenizers available from XMR. It is understood, however, that the apparatus of FIG. 1 is not intended to limit the application of the present invention. For example, some applications may neither permit nor require the use of a high vacuum during laser cleaning.

After a sample (14) was inserted into the vacuum chamber (15), the chamber pressure was reduced to less than about $10^{-6}$ Torr using a turbomolecular pump (16). The surface was then irradiated with laser pulses covering an area of about 0.5 cm square (0.25 cm²) at the energy density specified in each example.

Pulse energy densities were measured at the sample surface plane using a Gen-Tec Model PRJ-M meter equipped with an ED100 fast response joule-meter. Pulse energies were confirmed independently using a Scientech Model 36001 surface absorbing disk colorimeter. Measured energy densities were identical to within about 10%. A laser pulse duration of about 80 nanoseconds was used in all experiments.

EXAMPLE 1

Example 1 illustrates the advantage of the invention in removing particulates and debris from a commercially available Si (100) wafer. The wafer was first cleaned using a conventional chemical etching process before it was laser cleaned.

The wafer was first washed for 10 min in 1,1,1-trichloroethane (TCA) at 77°-80° C. It was then submerged in acetone for 2 min at room temperature and then rinsed thoroughly with acetone from a wash bottle. The wafer was then rinsed and stored in deionized water. Next, the wafer was washed in a 5:1:1 mixture of deionized water, 30% $H_2O_2$ and 28% $NH_4OH$ for 2 min at 75° C. The $H_2O_2$ was added when the solution reached 75° C. The wafer was rinsed thoroughly and stored in deionized water. It was then washed in a 5:1:1 mixture of deionized water, 30% $H_2O_2$ and 37.5% HCl for 2 min at 75° C. Again, $H_2O_2$ was added when the solution reached 75° C. The wafer was rinsed thoroughly with deionized water and submerged in a 1:10 mixture of 49% HF and deionized water for 1 min. It was then rinsed thoroughly with deionized water and blown dry with clean $N_2$ gas. The wafer was then dipped briefly into 37.5% HCl, rinsed first with deionized water and then methanol, and then blown dry with clean $N_2$ gas.

All glass and plastic ware were soaked in a bath of 1:1 70% $HNO_3$ and concentrated sulfuric acid overnight (about 16 hr) followed by a thorough rinsing with deionized water prior to use. Teflon tweezers were used to handle the wafer and were similarly cleaned. Low particulate reagents were used.

An optical microscope was used to identify areas containing chemical, metallic and particulate contaminants remaining after the cleaning process or introduced by subsequent handling. These areas were laser cleaned as follows. The wafer was irradiated with homogenized pulses of about 0.3 J/cm² from the XeCl laser. The laser was stepped along a sweep axis after each pulse with an effective sweep velocity of about 1 cm/sec. Upon completion of each sweep, the laser was reoriented to sweep along an axis parallel to and overlapping with the previous trace until the entire surface was cleaned. Although particulates and debris remained on the wafer surface following the conventional cleaning, substantially all particulates and debris were removed from the wafer by laser cleaning.

EXAMPLE 2

Example 2 illustrates the effect of pulse intensity with respect to laser cleaning of a commercially available GaAs (100) wafer. The wafer was cleaned using an etching process conventional for wafers comprising Group II-VI and Group III-V compounds. Separate areas of the wafer were then laser cleaned using laser pulses of 0.05 J/cm² and 0.15 J/cm² intensity, respectively.

The wafer was conventionally cleaned by first washing it in 1,1,1-trichloroethane (TCA) for 2 min at 65° C. and then rinsing it with TCA from a wash bottle. These steps were repeated. The wafer was then washed in methanol for 2 min at 50° C. and rinsed with methanol. The methanol wash and rinse was repeated. The wafer was then blown dry with clean $N_2$ gas. Any excess solvent was removed (absorbed) by a piece of filter paper.

Just prior to laser cleaning, the wafer was dipped briefly into 37.5% HCl and then rinsed with deionized water, rinsed again with methanol and blown dry with clean $N_2$ gas. Excess solvent was absorbed by a piece of filter paper. All glass and plastic lab ware were soaked overnight (16 hr) in a 1:1 mixture of 70% $HNO_3$ and concentrated sulfuric acid and rinsed thoroughly with deionized water. The wafer was handled with Teflon tweezers which were similarly cleaned. Low particulate reagents were used.

Subsequent examination of the wafer with an optical microscope showed that chemical residues, particulates and other contaminants remained on the wafer surface. The microscope was used to select certain areas for laser cleaning. Homogenized pulses of 0.05 J/cm$^2$ and 0.15 J/cm$^2$ intensity were used for laser cleaning separate areas as in Example 1. Microscopic examination showed that particulates and debris remained after laser cleaning with 0.05 J/cm$^2$ pulses, but all detectable particulates and debris were removed by the 0.15 J/cm$^2$ pulses.

EXAMPLE 3

Example 3 illustrates that laser cleaning by the present invention may be enhanced by multiple cleaning of the surface. A commercially available silicon wafer was first conventionally cleaned following the procedures identified in Example 1. Thereafter, it was laser cleaned using 0.2 J/cm$^2$ homogenized pulses from the XeCl laser and a pulse repetition rate of 5 Hz. Microscopic examination showed that the first cleaning removed some, but not all, of the particulates from the wafer surface. The wafer was cleaned a second time using homogenized pulses of the same 0.2 J/cm$^2$ intensity. Microscopic examination showed that all detectable particulates were removed by the second cleaning.

EXAMPLE 4

Additional advantages of UV laser cleaning are further illustrated by Table 1. The table presents electron spectroscopy-chemical analysis (ESCA) data used to compare the relative carbon, oxygen, gallium and aresenic compositions at the surface of the GaAs wafer that was cleaned in Example 2 using the 0.15 J/cm$^2$ pulse intensities. The data in Table 1 was obtained by monitoring the Ga-2a, As-2d, C-1s and O-1s lines of the ESCA spectrum. The ESCA measurements were made with a Surface Science Laboratories SSX-100 spectrometer using a monochromatic Al K[$\alpha$] X-ray excitation source and a 500 $\mu$m diameter beam.

Table 1 shows the relative intensities at the C and O lines decreased following laser cleaning, indicating that hydrocarbon residues and contaminants were removed. Moreover, the Ga/As ratio remained essentially unchanged to within the detection limits of the ESCA spectrometer. This demonstrates that no thermal decomposition or severe loss of either element occurred during laser cleaning.

TABLE 1

| Element | Solvent Cleaned | | Laser Cleaned | |
| --- | --- | --- | --- | --- |
| | B Energy | Atom % | B Energy | Atom % |
| Ga 3d | 21.7 | 16.73 | 21.5 | 26.47 |
| As 3d | 43.2 | 11.14 | 43.2 | 17.96 |
| C 1s | 287.4 | 35.89 | 287.1 | 24.44 |
| O 1s | 534.6 | 36.23 | 533.8 | 31.13 |
| TOTAL % | | 100.00 | | 100.00 |

Table 1. ESCA data was obtained for the GaAs wafer of Example 2. The wafer was first cleaned using solvents and then laser cleaned using homogenized 0.15 J/cm$^2$ pulses from a XeCl excimer laser.

EXAMPLE 5

This example illustrates the advantages of laser cleaning in reducing metallic contaminants from a CdTe (III) surface. Secondary ion mass spectroscopy (SIMS) spectra were taken from a 0.8 cm $\times$ 0.6 cm sample which was first conventionally cleaned and then laser cleaned with a XeCl laser. Homogenized pulses 0.11 J/cm$^2$ in intensity were used in the laser cleaning.

The SIMS measurements were made using a Cameca IMS-3F ion microanalyzer. An oxygen/cesium primary ion beam was used to sputter the sample in a 10$^{-9}$ Torr vacuum chamber. The secondary ions were extracted from the sample and analyzed in a double focusing mass spectroscopy system. SIMS measurements following conventional cleaning showed pronounced accumulations of the alkali metals K, Mg, Ca and Na. These accumulations of metallic impurities were essentially eliminated by laser cleaning. Moreover, all detectable microparticulates were removed from the sample surface.

EXAMPLE 6

Example 6 illustrates the advantages of laser cleaning in removing particulates and residues from organic solvents and water from a quartz (fused silica) surface. Samples were first cleaned using a conventional chemical procedure and then exposed to microscopic contaminants to highlight the laser cleaning process.

The conventional cleaning protocol was as follows. Each sample was washed in a 1,1,1-trichloroethane (TCA) bath for 15 min at 65° C. and then rinsed thoroughly with TCA from a wash bottle. The sample was washed again in a second TCA bath for 5 min at 65° C. and rinsed thoroughly with TCA from a wash bottle. The sample was then washed in a methanol bath for 5 min at 40° C., rinsed with methanol from a wash bottle and blown dry with clean N$_2$ gas. The sample was then washed in a bath containing 5% Ethoquad ® C/25 solution with mild agitation. More vigorous agitation may be required for particles strongly adhering to the surface. (Ethoquad ® C/25 is a registered trademark for methylpolyoxyethylene (15) cocoammonium chloride, available from Armak.) Thereafter, the sample was rinsed thoroughly with deionized water and again in a methanol bath for 5 min at 40° C. The sample was rinsed thoroughly with methanol from a wash bottle. The sample was then placed on lint-free clean room paper and blown dry with clean N$_2$ gas.

Separate samples were then contaminated with either ultrafine particulates or a residual solvent film to highlight laser cleaning. Particulate contamination resulted from first suspending ultrafine particles (about 0.1 $\mu$m in diameter) in methanol, applying the suspension to the sample surface and allowing it to dry. A solvent film was formed by applying a mixture of equal parts water, methanol and TCA to the sample surface and allowing it to dry. Homogenized pulses of 0.30 J/cm$^2$ intensity from a XeCl laser was used to clean both particulates and solvent film from quartz surfaces. Samples viewed under a high resolution optical microscope (500$\times$ magnification using the Nomarski mode of illumination) showed effective removal of particulates and the solvent film without detectable changes at the sample surface.

EXAMPLE 7

This example illustrates the application of laser cleaning to amorphous thin film structures A beryllium thin film was deposited onto a substrate to a thickness of approximately 10 $\mu$m by vapor deposition. Localized areas of the surface were contaminated with both particulates and a solvent film as described in Example 6. The areas were then laser cleaned with 0.25 J/cm$^2$ homogenized pulses from the XeCl excimer laser. Examination under an optical microscope (500× magnification) showed removal of both particulates and solvent film without damage to the surface.

EXAMPLE 8

Example 8 illustrates the application of laser cleaning to a commercially available Winchester magnetic recording disk. The disk comprises a 60 nm CoNiP thin film deposited on an amorphous 12 μm non-magnetic NiP film which itself is deposited on a standard aluminum-magnesium alloy plate. Particulates and a solvent film were applied to the structure as described in Example 6.

The structure was then laser cleaned with 0.1 J/cm² homogenized pulses from the excimer laser. Examination under an optical microscope (500× magnification) showed that the particulates and solvent film were removed from the laser cleaned surface without damage to the surface.

That which is claimed is:

1. A method for treating a solid surface which surface is a member of the group of an essentially single crystalline material, an amorphous material and materials intermediate thereto, said method comprising irradiating said surface with one or more pulses of laser radiation wherein said radiation is essentially ultraviolet and wherein said pulses have a peak-power density that is sufficiently low and a pulse duration that is sufficiently short so that said pulses do not cause substantial chemical or physical change to said surface, and wherein said peak-power density and pulse duration are effective to result in substantial cleaning of said surface.

2. The method of claim 1 wherein the peak-power density of said pulses is uniform to at least about ±10%.

3. The method of claim 1 wherein the duration of said pulse is about 80 nanoseconds or less.

4. The method of claim 1 wherein the peak-power density of said pulses is uniform to at least about ±5%.

5. A method for treating a solid surface which surface is a member of the group of an essentially single crystalline material, an amorphous material and materials intermediate thereto, said method comprising irradiating said surface with one or more pulses of laser radiation wherein the wavelength of said radiation is in the range of from about 180 nm to about 435 nm and wherein said pulses have peak-power density that is sufficiently low and a pulse duration that is sufficiently short so that said pulses do not cause substantial chemical or physical change to said surface, and wherein said peak-power density and pulse duration are effective to result in substantial removal of particulates and impurities from said surface 6. The method of claim 5 wherein the peak-power density of said pulses is uniform to at least about ±10%.

7. The method of claim 5 wherein the duration of said pulses is about 80 nanoseconds or less.

8. The method of claim 5 wherein the peak-power density of said pulses is uniform to at least about ±5%.

9. The method of claim 2 wherein said solid surface is an essentially single crystalline material.

10. The method of claim 2 wherein said solid surface is an essentially amorphous material.

11. The method of claim 2 wherein said solid surface is intermediate to an essentially single crystalline material and an essentially amorphous material.

12. The method of claim 1 wherein said irradiation is adminstered to said surface in the absence of a gas flowing constantly across said surface.

13. The method of claim 1 wherein said irradiation is administered to said surface while said surface is subjected to vacuum conditions.

14. The method of claim 5 wherein said irradiation is adminstered to said surface in the absence of a gas flowing constantly across said surface.

15. The method of claim 14 wherein the duration of said pulses is about 80 nanoseconds or less and the peak-power density of said pulses is uniform to at least about ±10%.

16. The method of claim 5 wherein said irradiation is administered to said surface while said surface is subjected to vacuum conditions.

17. The method of claim 16 wherein the duration of said pulses is about 80 nanoseconds or less and the peak-power density of said pulses is uniform to at least about ±10%.

* * * * *